(12) United States Patent
Yamauchi

(10) Patent No.: US 10,141,036 B2
(45) Date of Patent: Nov. 27, 2018

(54) SEMICONDUCTOR MEMORY DEVICE AND READING METHOD THEREOF

(71) Applicant: Winbond Electronics Corp., Taichung (TW)

(72) Inventor: Kazuki Yamauchi, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/672,310

(22) Filed: Aug. 9, 2017

(65) Prior Publication Data

US 2018/0061464 A1    Mar. 1, 2018

(30) Foreign Application Priority Data

Aug. 24, 2016   (JP) .................................. 2016-163324

(51) Int. Cl.

| | |
|---|---|
| *G11C 16/06* | (2006.01) |
| *G11C 7/12* | (2006.01) |
| *G11C 7/14* | (2006.01) |
| *G11C 7/18* | (2006.01) |
| *G11C 11/413* | (2006.01) |
| *G11C 7/02* | (2006.01) |
| *G11C 16/04* | (2006.01) |
| *G11C 16/24* | (2006.01) |
| *G11C 29/52* | (2006.01) |
| *G11C 29/04* | (2006.01) |

(52) U.S. Cl.
CPC .................. *G11C 7/12* (2013.01); *G11C 7/02* (2013.01); *G11C 7/14* (2013.01); *G11C 7/18* (2013.01); *G11C 11/413* (2013.01); *G11C 16/0483* (2013.01); *G11C 16/24* (2013.01); *G11C 29/52* (2013.01); *G11C 2029/0411* (2013.01); *G11C 2207/005* (2013.01)

(58) Field of Classification Search
CPC ........................................................ G11C 7/12
USPC .................................................... 365/185.25
See application file for complete search history.

(56) References Cited

U.S. PATENT DOCUMENTS

| | | | |
|---|---|---|---|
| 6,917,541 B2 | 7/2005 | Shimbayashi et al. | |
| 2005/0135157 A1* | 6/2005 | Shiga | G11C 16/344 365/185.29 |
| 2012/0051146 A1 | 3/2012 | Shibata | |

(Continued)

FOREIGN PATENT DOCUMENTS

| | | |
|---|---|---|
| CN | 102148056 | 8/2011 |
| JP | 5631436 | 11/2014 |

OTHER PUBLICATIONS

"Office Action of Taiwan Counterpart Application," dated Apr. 18, 2018, p. 1-p. 8.

*Primary Examiner* — Hoai V Ho
(74) *Attorney, Agent, or Firm* — JCIPRNET

(57) ABSTRACT

The invention provides a semiconductor memory device and a reading method thereof, which are capable of suppressing a peak current when pre-charging a bit line are provided. The reading method of a flash memory of the present invention includes steps of: pre-charging a selected bit line; and reading a voltage or a current of the pre-charged selected bit line. The step of pre-charging is performed by pre-charging a sense node SNS to Vcc–Vth at a time t1, pre-charging a node TOBL to VCLAMP2 at a time t2, pre-charging the node TOBL to VCLAMP1 at a time t5, and pre-charging the sense node SNS to Vcc at a time t6.

17 Claims, 5 Drawing Sheets

(56) References Cited

U.S. PATENT DOCUMENTS

2012/0230115 A1  9/2012  Shibata
2017/0110186 A1* 4/2017  Sasaki ................ G11C 11/5642

* cited by examiner

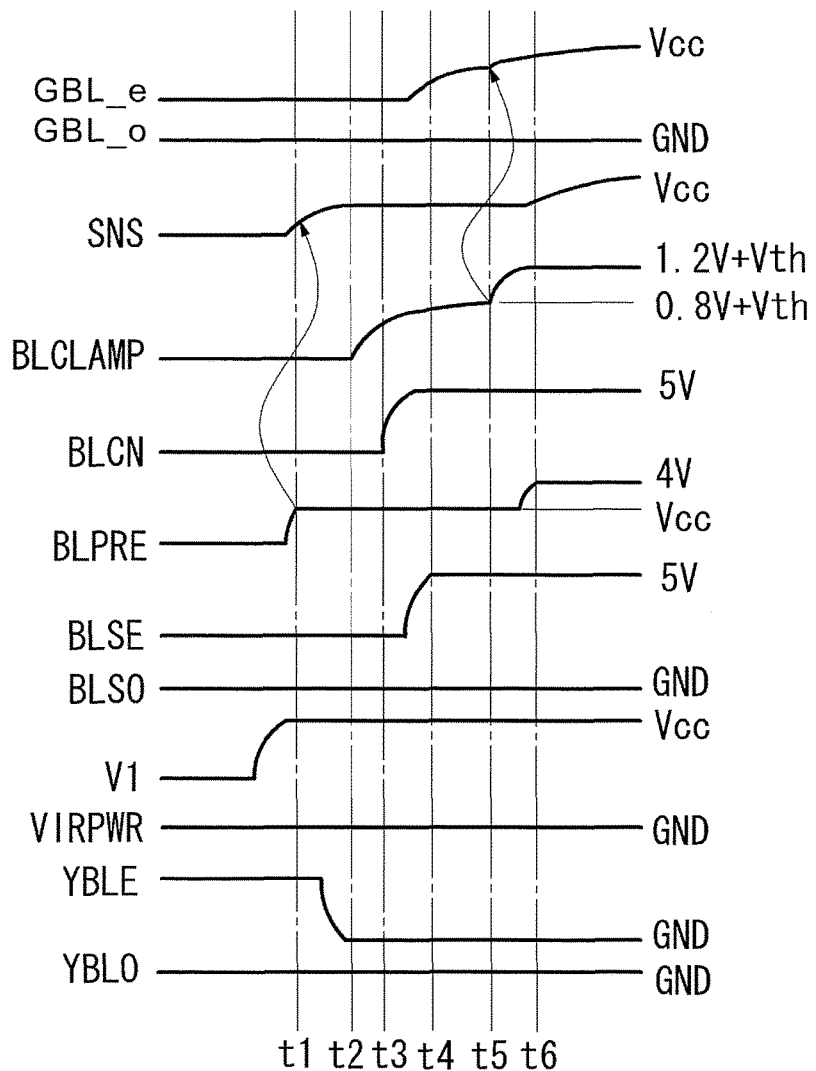
FIG. 6
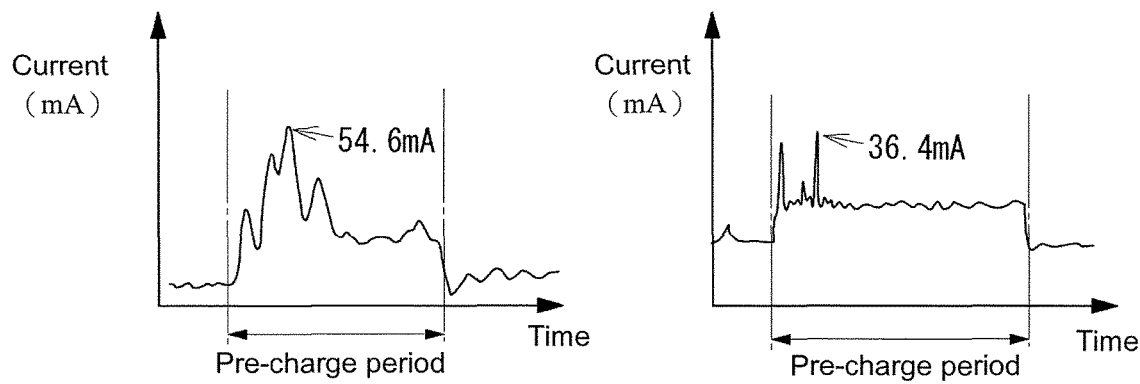
FIG. 7A
FIG. 7B

SEMICONDUCTOR MEMORY DEVICE AND READING METHOD THEREOF

CROSS-REFERENCE TO RELATED APPLICATION

This application claims the priority benefit of Japan application serial no. 2016-163324, filed on Aug. 24, 2016. The entirety of the above-mentioned patent application is hereby incorporated by reference herein and made a part of this specification.

BACKGROUND OF THE INVENTION

1. Field of the Invention

The invention relates to a reading of a semiconductor storage device, such as an NAND flash memory, and more particularly, to a pre-charging of a bit line.

2. Description of Related Art

When reading pages in the NAND flash memory, a page buffer/sense circuit is used to pre-charge a bit line, and the bit line is discharged according to a storage state of a selected memory cell. Later, a potential or a current of the bit line is sensed at a sense node. When a resistance of the bit line becomes higher due to miniaturization and a capacitance of the bit line increases due to an increasing number of pages, a time required for charging/discharging the bit line becomes longer so it will take longer to read data. Accordingly, in Patent Document 1, a pre-charging circuit is disposed between blocks so as to shorten a pre-charging time for the bit line.

PRIOR ART DOCUMENT

Patent Document

Patent Document 1: Japanese Patent Publication No. 5631436

Problems to be Solved by the Invention

In the NAND flash memory, when the potential of the bit line is to be read during a reading operation/a verifying operation, the bit line is pre-charged by the page buffer/sense circuit. When pre-charging the bit lines in the page, because each bit line crosses all blocks on a memory cell array, a parasitic capacitance is very large. Moreover, a capacitor included in each page buffer also becomes a pre-charging target. Therefore, an overall capacitance for pre-charging will become huge. If the pre-charging is started for all the capacitors at the same time, a large current will flow in an instant, which becomes the reason why a power voltage drops. In particular, this has a great impact to a low power voltage device. As such, in the case of an on-chip ECC (Error Checking and Correction) or a continuous reading, the power voltage may drop due to a data outputting, an ECC operation and a reading operation on the memory array being repeatedly performed, resulting in problems including, for example, reading failures under a requested speed.

SUMMARY OF THE INVENTION

The invention aims to solve the known problems by providing a semiconductor storage device for suppressing a peak current when pre-charging a bit line.

Technical Means for Solving the Problem

A reading method of the semiconductor storage device includes steps of: pre-charging a selected bit line; and reading a voltage or a current of the pre-charged selected bit line. The step of pre-charging the selected bit line includes steps of: pre-charging a sense node to a first voltage; for a bit line node between the sense node and a bit line, pre-charging the bit line node to a first clamp voltage based on the first voltage of the sense node; pre-charging the bit line node to a second clamp voltage greater than the first clamp voltage after pre-charging the selected bit line by the first clamp voltage; and pre-charging the sense node to a second voltage greater than the first voltage.

A semiconductor memory device of the invention includes: a memory cell array, formed with a plurality of memory cells; and a reading part, for reading data stored in the memory cells of the memory cell array. The reading part includes a sense circuit. The sense circuit pre-charges a selected bit line and reads a voltage or a current of the pre-charged selected bit line. The sense circuit includes a pre-charging transistor for pre-charging a sense node and a clamp transistor connected between the sense node and a bit line. The reading part pre-charges the sense node multiple times by the pre-charging transistor and pre-charges the selected bit line multiple times by the clamp transistor.

Effect of the Invention

According to the invention, by pre-charging the sense node multiple times and pre-charging the bit line multiple times, the peak current and its noise may be suppressed when pre-charging the bit line. As a result, the power voltage can be prevented from dropping to avoid expected operational failures.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6 is a timing diagram illustrating operations of each part when pre-charging according to the present embodiment.

FIG. 7A and FIG. 7B are diagrams illustrating peak current noises as a comparison result of a conventional pre-charging method and a pre-charging method of the present embodiment.

DESCRIPTION OF THE EMBODIMENTS

Figure 1:
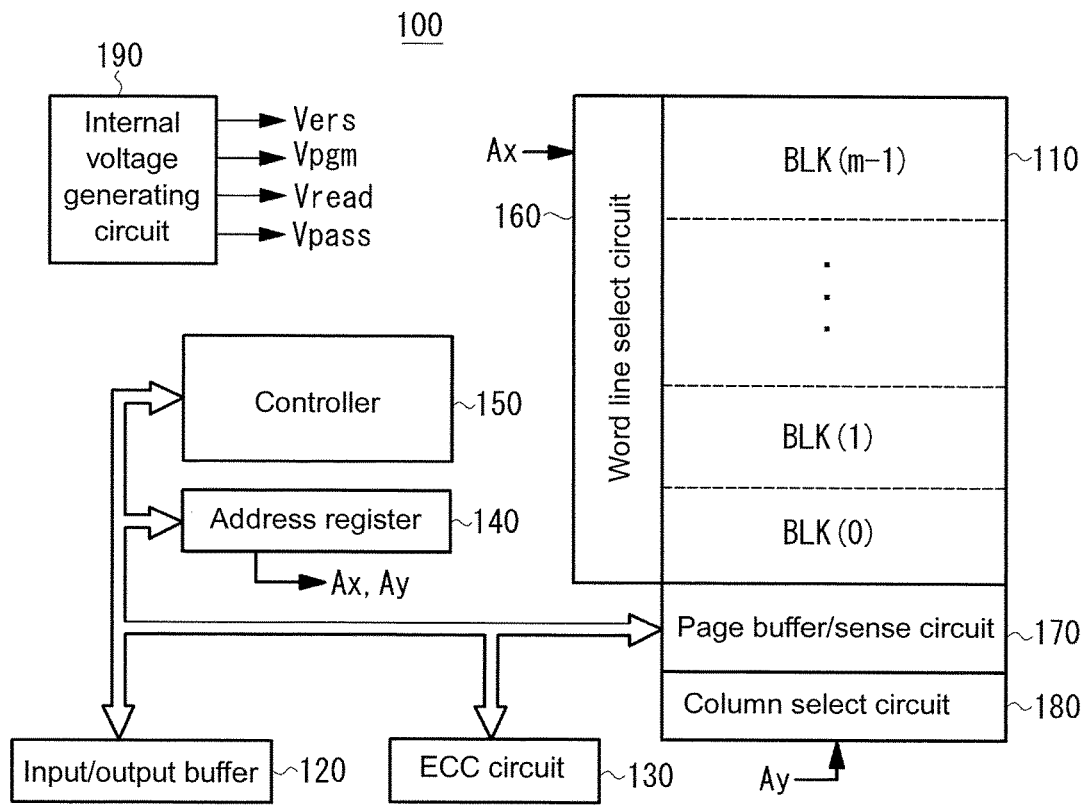
FIG. 1 is a diagram illustrating a structure of an NAND flash memory according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention are described in detail below by reference with accompanied figures. Methods for suppressing the power voltage from dropping when pre-charging include a layout-related method such as separating wiring for the power, a circuit-related method such as inserting a resistor into a power source, etc. In the present embodiment, a logic sequence control is used as the method for suppressing the peak current noise.

FIG. 1 is a diagram illustrating a structure of an NAND flash memory according to an embodiment of the invention. A flash memory 100 of the present embodiment includes: a memory array 110, formed by a plurality of memory cells arranged in matrix; an input/output buffer 120, connected to an external input/output terminal I/O for holding input/output data; an ECC circuit 130, for performing an error checking/correcting on data programmed in the memory array 110 or data read from the memory array 110; an address register 140, for receiving address data from the input/output buffer 120; a controller 150, for controlling each part based on command data or a control signal from an external host device; a word line select circuit 160, for receiving row address information Ax from the address register 140, decoding the row address information Ax, and performing a block selection and a word line selection based on a decoding result; a page buffer/sense circuit 170, for holding data read from a page selected by the word line select circuit 160, or holding data to be programmed into a selected page; a column selection circuit 180, for receiving column address information Ay from the address register 140, decoding the column address information Ay, and performing a column selection in the page buffer/sensing circuit 170 based on a decoding result; and an internal voltage generating circuit 190, for generating various voltages (a write voltage Vpgm, a pass voltage Vpass, a read pass voltage Vread, an erase voltage Vers, etc.) required for reading, programming and erasing data.

The memory array 110 has m storage blocks BLK(0), BLK(1), . . . , and BLK(m−1) disposed along a column direction. In one storage block, a plurality of NAND strings are formed, and the NAND string is formed by connecting multiple memory cells in series. The NAND string may be a 2D array formed on a surface of a substrate, and may also be a 3D array formed utilizing a semiconductor layer on the surface of the substrate. Further, the memory cell may be a SLC (Single Level Cell) type for storing one bit (binary data) and may also be an MLC (Multi Level Cell) type for storing multiple bits.

Figure 2:
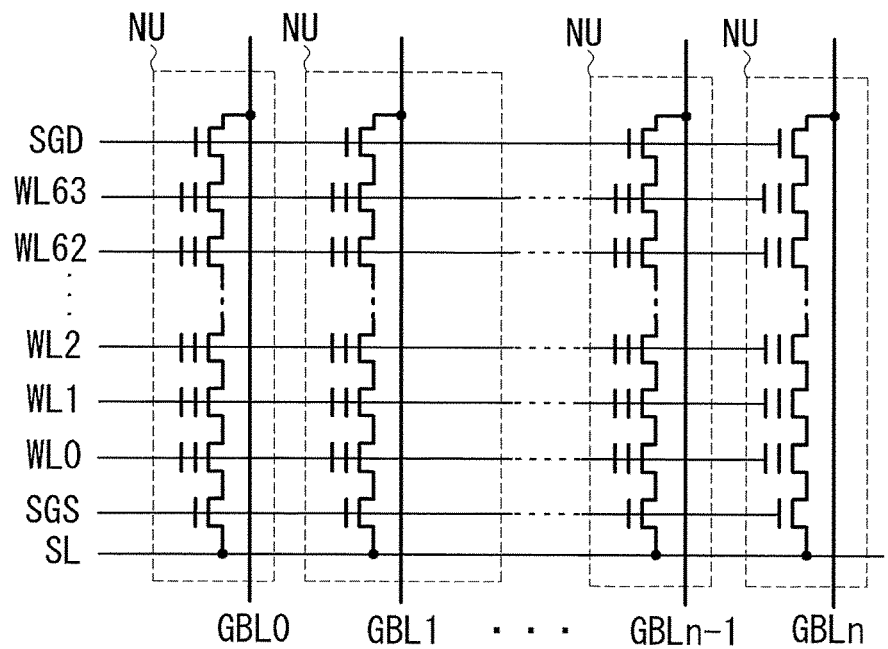
FIG. 2 is a circuit diagram illustrating a structure of an NAND string in a block of a memory cell array according to an embodiment of the invention.

In one block, as shown in FIG. 2, a plurality of NAND string units NU are formed by the multiple memory cells connect in series. As shown in the drawing, in one block, n+1 NAND strings NU are arranged along a row direction. The NAND string unit NU includes: a plurality of memory cells (the drawing shows 64 in total) connected in series; a bit line side select transistor, connected to a drain side of the memory cell in one end; and a source line side select transistor, connected to a source side of the memory cell. A drain of the bit line side select transistor is connected to one corresponding bit line among bit lines GBL0 to GBLn, and a source of the source line side select transistor is connected to a common source line SL.

Table 1 is a table showing bias voltages applied in each operation of the flash memory. During a reading operation, a specific positive voltage is applied to the bit line; a specific voltage (e.g., 0 V) is applied to a selected word line; the pass voltage Vpass (e.g., 4.5 V) is applied to a non-selected word line; a positive voltage (4.5 V) is applied to selected gate lines SGD and SGS such that the bit line side select transistor and the source line side select transistor of the NAND string are turned on and 0 V is applied to the common source line. During a programming (writing) operation, the program voltage Vpgm (15 V to 20 V) of a high voltage is applied to the selected word line; an intermediate potential (e.g., 10 V) is applied to the non-selected word line such that the bit line side select transistor is turned on and the source line side select transistor is turned off to provide a potential corresponding to data "0" or "1" to the bit line. During an erasing operation, 0 V is applied to the selected word line in the block and a high voltage (e.g., 21 V) is applied to a P-well to extract electrons of a floating gate to the substrate, such that the data is erased using block as a unit.

TABLE 1

|  | Erasing | Writing | Reading |
| --- | --- | --- | --- |
| Selected word line | 0 | 15~20 V | 0 |
| Non-selected word line | F | 10 V | 4.5 |
| SGD | F | Vcc | 4.5 |
| SGS | F | 0 | 4.5 |
| SL | F | Vcc | 0 |
| P-well | 21 | 0 | 0 |

The ECC circuit 130 may be set as enabled or disabled by commands or factory settings. Given that the function of the on-chip ECC is enabled, when the programmed data input via the input/output buffer 120 is loaded to the page buffer/sense circuit 170 during the programming operation, the ECC circuit 130 performs operations on data transmitted from the page buffer/sense circuit 170, generates an ECC code, and stores the generated ECC code into a spare area of the page buffer/sense circuit 170. In this way, the data and the ECC code set for the page buffer/sense circuit 170 are programmed into the selected page of the memory array 110.

On the other hand, during the reading operation, when the data read from the selected page of the memory array 110 is held in the page buffer/sense circuit 170, the ECC circuit 130 performs checks for errors on the read data based on the data and the ECC code transmitted from the page buffer/sense circuit 170. If an error is detected, a corrected data is set in the page buffer/sensing circuit 170. Further, the data held by the page buffer/sense circuit 170 is outputted to the outside via the input/output buffer 120.

Figure 3:
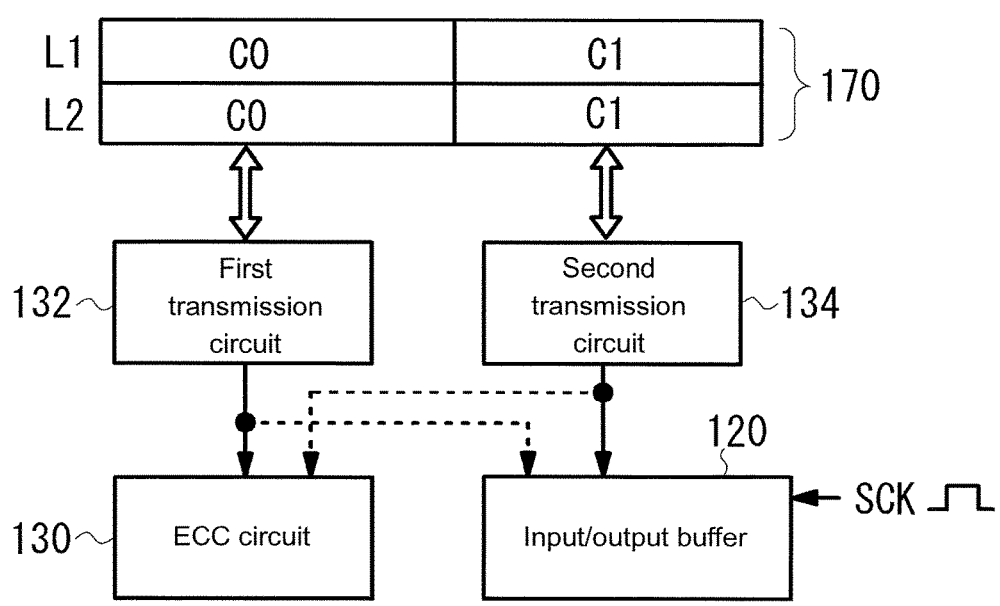
FIG. 3 is diagram illustrating operations of a first latch circuit and a second latch circuit of a page buffer/sense circuit.

Next, detailed conditions of latch circuits included in the page buffer/sense circuit 170 are described as follows. As shown in FIG. 3, the page buffer/sense circuit 170 includes: a first latch circuit L1, for holding data read from a memory cell array or holding data to be programmed into the memory cell array; and a second latch circuit L2, capable of performing a bidirectional data transmission with the first latch circuit L1. The first latch circuit L1 can hold data of one page (e.g., 2 KB), and the first latch circuit L1 is provided with a first cache part C0 (e.g., 1 KB) and a second cache part C1 (e.g., 1 KB).

The second latch circuit L2 can also hold data of one page, and is provided with the first cache part C0 and the second cache part C1. The first cache part C0 and the second cache part C1 of each of the first latch circuit L1 and the second latch circuit L2 are capable of independently holding data or transmitting data. For example, the data held by the first cache part C0 of the first latch circuit L1 may be transmitted to the first cache part C0 of the second latch circuit L2, or the data held by the second cache part C1 of the first latch circuit L1 may be transmitted to the second cache part C1 of the second latch circuit L2.

Further, a first transmission circuit 132 and a second transmission circuit 134 for performing the bidirectional data transmission are provided between the second latch circuit L2, the ECC circuit 130 and the input/output buffer 120. The first transmission circuit 132 can perform a data transmission between the first cache part C0 of the second latch circuit L2, the ECC circuit and the input/output buffer 120, and the second transmission circuit 134 can perform a data transmission between the second cache part C1 of the second latch circuit L2, the ECC circuit 130 and the input/output buffer 120.

When the first transmission circuit 132 transmits the data of the first cache part C0 to the ECC circuit 130, the second transmission circuit 134 can transmit the data of the second cache part C1 to the input/output buffer 120. On the other hand, when the first transmission circuit 132 transmits the data of the first cache part C0 to the input/output buffer 120, the second transmission circuit 134 can transmit the data of the second cache part C1 to the ECC circuit 130. That is to say, during a period in which data in one half of the page of the second latch circuit L2 is outputted, with an ECC process performed on data in the remaining half of the page, page data underwent the ECC process may be continuously outputted. Accordingly, in the continuous reading operation, during a period in which a data is outputted and the ECC process is performed in the second latch circuit L2, the next page is read from the memory cell array, and the read data is held in the first latch circuit L1.

As a serial interface function of the flash memory 100, the input/output buffer 120 can perform a serial inputting and a serial outputting in synchronization with an external serial clock signal SCK. A bit wide for the serial inputting or the serial outputting may be any of ×1, ×2, ×4, ×8, etc.

Figure 4:
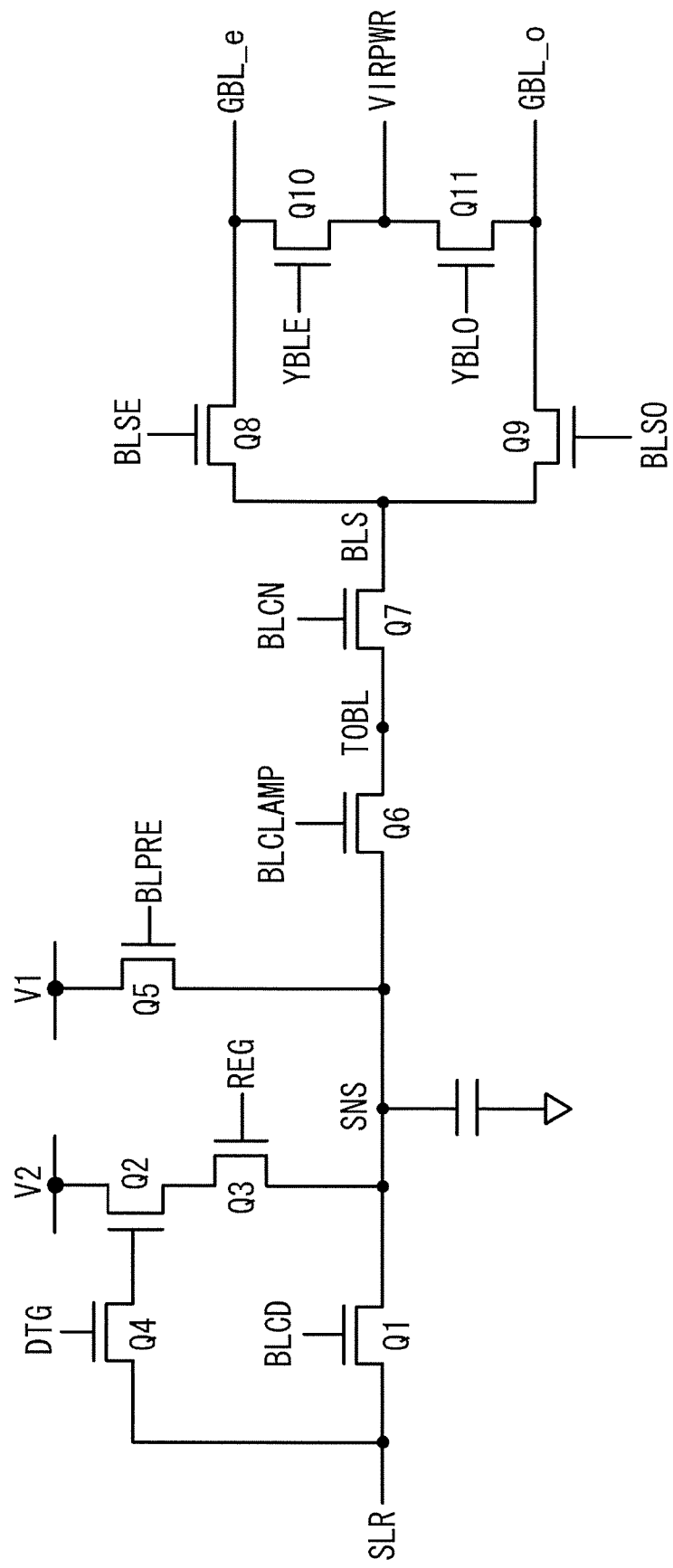
FIG. 4 is a circuit diagram illustrating a structure of a sense circuit and a bit line select circuit of the flash memory according to the present embodiment.

FIG. 4 is an example of one page buffer/sense circuit commonly used by two bit lines consisting of one even bit line and one odd bit line. The page buffer/sensing circuit 170 includes: a sense circuit, for sensing data read onto the bit line, or setting a voltage corresponding to the data "0" or "1" to be programmed for the bit line; and a latch circuit (the first latch circuit L1 and the second latch circuit L2 in FIG. 3), for holding the read data or the data to be programmed.

The latch circuit includes two cross coupling inverters, wherein one node SLR is connected to the sense circuit. The sense circuit includes: a transistor Q1 connected between the node SLR and a sense node SNS for transmitting charges; transistors Q2 and Q3 connected in series between the sense node SNS and a voltage supply part V2; a transistor Q4 connected between the node SLR and a gate of the transistor Q2; a transistor Q5 connected between a voltage supply part V1 and the sense node SNS for providing a pre-charging voltage and the like to the bit line; and transistors Q6 and Q7 for clamping the voltage of the bit line. These transistors Q1 to Q7 are N-channel Metal Oxide Semiconductor (NMOS) transistors. Whether the transistor Q3 and the transistor Q4 are turned on is controlled by a REG signal and a DTG signal, respectively.

Further, the sense circuit is connected to a node BLS of a bit line select circuit. The bit line select circuit includes: a transistor Q8 for selecting an even bit line GBL_e, a transistor Q9 for selecting an odd bit line GBL_o, a transistor Q10 for connecting a virtual power VIRPWR to the even bit line GBL_e, and a transistor Q11 for connecting the virtual power VIRPWR to the odd bit line GBL_o. These transistors Q8 to Q11 are NMOS transistors. For example, during the reading operation, when the even bit line GBL_e is selected, the transistor Q10 is turned off, the transistor Q11 is turned on, and 0 V is provided from the virtual power VIRPWR to the odd bit line GBL_o; when the odd bit line GBL_o is selected, the transistor Q10 is turned on, the transistor Q11 is turned off, 0 V is provided from the virtual power VIRPWR to the even bit line GBL_e, so as to perform a bit line shield reading. During the programming operation, a bias voltage is applied from the virtual power VIRPWR for the non-selected bit line so as to suppress a FG coupling between the memory cells.

Figure 5:
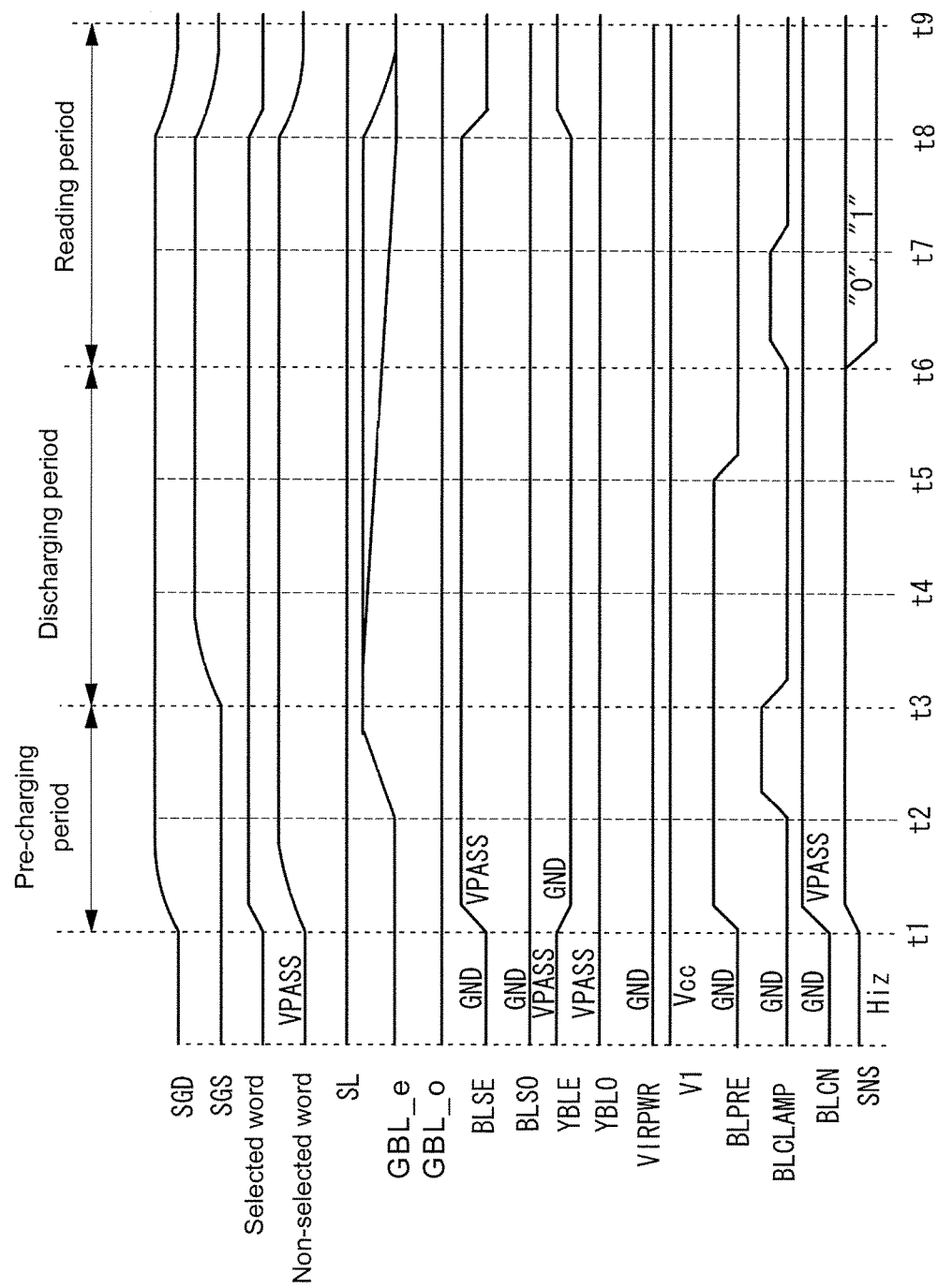
FIG. 5 is a timing diagram illustrating operations of each part in a conventional reading operation.

Next, a general reading operation is described as follows. Herein, it is assumed that the even bit line GBL_e is selected, and timing waveforms of each part at the time are as shown in FIG. 5. At a time t1, the transistor Q5 is turned on by a BLPRE signal and the sense node SNS is pre-charged. The voltage supply part V1 provides Vcc (or Vdd), so the sense node SNS is pre-charged to Vcc−Vth (Vth is a threshold of the transistor Q5). Further, a signal BLCN becomes a pass voltage (e.g., 5 V), the transistor Q7 enters a turned-on state, and the sense circuit is electrically coupled to the node BLS. In the bit line select circuit, a BLSE signal becomes the pass voltage, a BLSO signal becomes GND, an YBLE signal becomes GND from the pass voltage, an YBLO signal becomes the pass voltage, and the virtual power VIRPWR becomes GND. On the other hand, in the NAND string, a SGD signal becomes the pass voltage, the bit line side transistor is turned on, a specific positive read voltage is applied to the selected word line, and the pass voltage is applied to the non-selected word line.

Next, during a period from a time t2 to a time t3, a BLCLAMP signal becomes H level, and the transistor Q6 is turned on. In this way, the even bit line GBL_e is pre-charged to a clamp voltage by the charges of the sense node SNS. A period from the time t1 until the time t3 is in fact a pre-charging period of the selected bit line.

Next, during a period from the time t3 to a time t4, a SGS signal becomes the pass voltage, the source line side transistor is turned on, the voltage of the even bit line GBL_e is selectively discharged in correspondence to a storage state of the selected memory cell. That is to say, if the selected memory cell is stored with data "0", the selected memory cell is turned off and the voltage of the even bit line GBL_e is not discharged. However, if the selected memory cell is stored with data "1", the selected memory cell is turned on and the voltage of the even bit line GBL_e is discharged to the source line SL. At a time t5, the BLPRE signal becomes GND, the transistor Q5 is turned off During a period from a time t6 to a time t7, the BLCLAMP signal becomes H level, the transistor Q6 is turned on, and the data of the selected memory cell is shown at the sense node SNS. At a time t8, the SGD signal, the SGS signal, the selected word line, the non-selected word line and the BLSE signal become GND, the YBLE signal becomes the pass voltage, and a reading period is over. Subsequently, the transistor Q1 is turned on by the BLCD signal, and the charges of the sense node SNS are transmitted to the node SLR of the latch circuit and held therein. The data held by the latch circuit is outputted from the input/output buffer 120 via a data line.

In the NAND flash memory with SPI (Serial Peripheral Interface) functions, when the continuous reading for pages is performed, as described above, the ECC process is performed while the data is being outputted. Also, during this period, the next page is read from the memory cell array. That is to say, three operations are performed at the same time. All the bit lines must be pre-charged when reading data from the memory cell array so the loading is large, and thus the power voltage may drop when said three operations are performed at the same time. Especially, in the NAND flash memory with SPI functions, the total number of pads is small, and the number of power supply pads is also small (e.g., one). Moreover, in a low power voltage product (e.g., 1.5 V), when the power voltage drops, a driving capability of the transistors will also drop to create a great impact. Therefore, for example, if the power voltage drops during the process of outputting data, it is also possible that an output driver is unable to operate with a normal speed, and thus unable to realize the data reading in synchronization with the external serial clock signal SCK.

In the reading operation of the present embodiment, in order to reduce noises caused by the peak current when pre-charging the bit line, the sense node is pre-charged with multiple steps and/or the bit line is pre-charged with multiple steps. In one preferred example, the controller 150 changes two t conventional pre-charging steps in the reading operation to six steps, so each step can be performed by a cycle of 100 ns. The pre-charging period of the present embodiment does not exceed the conventional pre-charging period as shown by the time t1 to the time t5 in FIG. 5. FIG. 6 is a timing diagram when pre-charging the bit line according to the present embodiment.

Vcc is provided to the voltage supply part V1. In this example, it is assumed that a voltage of 1.7 V is provided to the low power voltage product. At the time t1, the BLPRE signal changes from GND to Vcc. A threshold of the transistor Q5 is, for example, 0.7 V. Accordingly, the sense node SNS is pre-charged to Vcc−Vth (if the threshold is 0.7 V, the sense node SNS is 1.0 V). A capacitor is coupled on the sense node SNS. For example, if one page is 2 KB, it is required to charge the loading for the sense node SNS of 2 KB overall. In the prior art, the sense node SNS is pre-charged one single time by applying the pass voltage (e.g., 4.5 V) to the BLPRE signal, and thus there will be a large current flowing to the sense node SNS at once. In the present embodiment, the sense node SNS is pre-charged multiple times (e.g., in two stages), so as to prevent the large current outflowing to the sense node SNS at once from happening.

At the time t2, the BLCLAMP signal changes from GND to a voltage for turning on the transistor Q6. Such a gate voltage is, for example, a voltage at which a potential of a node TOBL being lower than a potential of the sense node SNS. If the sense node SNS is 1.0 V, the BLCLMAP signal is, for example, 0.8 V+Vth (Vth is a threshold of the transistor Q6, and the BLCLMAP signal is 1.5 V if Vth is 0.7 V). In addition, for clearer description, the voltage of the node TOBL at the time t2 is called "VCLAMP2".

In the conventional reading, at the time t2 in FIG. 5, the BLCLAMP signal suddenly changes to H level, and the transistor Q6 is turned on (meanwhile, the BLCN signal is at H level, and the transistor Q7 is in the turned-on state). In such way, a very large current will flow through the bit line because current flows through the selected bit lines for pre-charging all at once. In the present embodiment, the operation of clamping the transistor Q6 are performed multiple times, and more preferably, performed a number of times equal to a number of times pre-charging the sense node SNS. Accordingly, the current flowing to the selected bit line is divided into multiple parts.

At the time t3, the BLCN signal changes from GND to a voltage higher than Vcc, and the transistor Q7 is turned on. For example, the BLCN signal is 5 V. The voltage higher than Vcc is generated by the internal voltage generating circuit 190. With the transistor Q7 strongly turned on, the node BLS is pre-charged to VCLAMP2 (e.g., 0.8 V) substantially equal to that of the node TOBL.

At the time t4, the BLSE signal changes from GND to a voltage higher than Vcc, and the transistor Q8 is turned on. For example, the BLSE signal is 5 V. In addition, the transistors Q7 to Q11 may also include transistors with higher voltage-withstand than the transistors Q5 and Q6. With the transistor Q8 turned on, the node BLS is connected to the selected bit line GBL_e, and the selected bit line GBL_e is pre-charged to VCLAMP2 (e.g., 0.8 V) equal to that of the node BLS.

Next, at the time t5, the BLCLAMP signal changes to a voltage level of VCLAMP1 (VCLAMP1>VCLAMP2) generated at the node TOBL. For example, when VCLAMP1 is 1.2 V, the BLCLAMP signal changes to 1.2 V+Vth (the BLCLAMP signal is 1.9 V if Vth is 0.7 V). Meanwhile, a pre-charging potential Vcc−Vth of the sense node SNS is provided to the node TOBL, the node BLS and the selected bit line GBL_e via the transistor Q6, so the whole is pre-charged to Vcc−Vth (1.0 V).

At the time t6, the BLPRE signal changes to a voltage higher than Vcc (e.g., 4 V), and the transistor Q5 is strongly turned on. As a result, the sense node SNS is pre-charged with Vcc as the target. As such, the selected bit line GBL_e is eventually pre-charged from the node TOBL to the 1.2 V (VCLAMP1) as the target.

FIG. 7A shows a current waveform when pre-charging with two stages in the prior art with Vcc being 2.0 V. A peak of the current is approximately 54.6 mA. On the other hand, FIG. 7B is a current waveform when pre-charging with six stages of the present embodiment, and a peak value of the current is approximately 36.4 mA, which allows a peak current value to be reduced by 18.2 mA compared to the prior art.

Accordingly, in the present embodiment, by pre-charging multiple times for the sense node and/or pre-charging multiple times for the selected bit line, the peak current may be reduced when pre-charging the bit line. In particular, when the continuous reading is to be performed in the flash memory corresponding to SPI functions, because data outputting with the help of the output driver, the ECC-based operation and reading from the memory cell array must be performed repeatedly, reducing the peak value of the pre-charging current for the bit line can prevent the power voltage from dropping.

In addition, it is exemplified in the embodiments using the NAND flash memory with the SPI functions. Nonetheless, the invention is also applicable to the common NAND flash memories or NOR flash memories without the SPI functions. In short, the invention is applicable to any memory capable of pre-charging the bit line during the reading operation. Moreover, the sensing circuit may be either one of a voltage detection type or a current detection type as long as the bit line can be pre-charged.

Furthermore, in the embodiments, although six steps are used for pre-charging the bit line (e.g., example showing that the odd page or the even page are alternately read), the steps for reading the BLSE signal or the BLSO signal are not required as long as the reading is for all the bit lines.

It will be apparent to those skilled in the art that various modifications and variations can be made to the structure of the present invention without departing from the scope or spirit of the present disclosure. In view of the foregoing, it is intended that the present disclosure cover modifications and variations of this disclosure provided they fall within the scope of the following claims and their equivalents.

What is claimed is:

1. A reading method of a semiconductor storage device, comprising steps of:
   pre-charging a selected bit line; and
   reading a voltage or a current of the pre-charged selected bit line through a sense node,
   wherein the step of pre-charging the selected bit line comprises steps of:
   pre-charging the sense node to a first voltage;
   for a bit line node coupled between the sense node and a bit line, pre-charging the bit line node to a first clamp voltage based on the first voltage of the sense node;
   pre-charging the bit line node to a second clamp voltage greater than the first clamp voltage after pre-charging the selected bit line by the first clamp voltage; and
   pre-charging the sense node to a second voltage greater than the first voltage.

2. The reading method as recited in claim 1, wherein the sense node is pre-charged by a first transistor, and the bit line node is pre-charged by a second transistor.

3. The reading method as recited in claim 2, wherein the first voltage is pre-charged to the sense node by applying a first signal voltage to a gate of the first transistor, the second voltage is pre-charged to the sense node by applying a second signal voltage to the gate of the first transistor, and the second signal voltage is greater than the first signal voltage.

4. The reading method as recited in claim 2, wherein the bit line node is pre-charged to the first clamp voltage by applying the first clamp voltage to a gate of the second transistor, the bit line node is pre-charged to the second clamp voltage by applying the second clamp voltage to the gate of the second transistor, and the second clamp voltage is greater than the first clamp voltage.

5. The reading method as recited in claim 1, wherein the step of pre-charging the selected bit line further comprises:
   pre-charging the first clamp voltage of the bit line node to a node coupled to the bit line; and
   pre-charging the second clamp voltage of the bit line node to the node coupled to the bit line.

6. The reading method as recited in claim 5, wherein the node coupled to the bit line is pre-charged by a third transistor.

7. The reading method as recited in claim 5, wherein the step of pre-charging the selected bit line further comprises:
   pre-charging an even bit line or an odd bit line based on a voltage pre-charged to the node coupled to the bit line.

8. The reading method as recited in claim 7, wherein the even bit line or the odd bit line are pre-charged by an even bit line select transistor or an odd bit line select transistor.

9. The reading method as recited in claim 1, wherein outputting previously-read data when pre-charging the selected bit line.

10. The reading method as recited in claim 1, wherein outputting previously-read data and performing an error checking and correction operation when pre-charging the selected bit line.

11. The reading method as recited in claim 1, wherein the semiconductor memory device is an NAND flash memory.

12. A semiconductor memory device, comprising:
    a memory cell array, formed with a plurality of memory cells; and
    a reading part, coupled to the memory cell array, for reading data stored in the memory cells of the memory cell array,
    the reading part comprising a sense circuit, the sense circuit pre-charging a selected bit line and reading a voltage or a current of the pre-charged selected bit line, wherein the selected bit line is coupled between the memory cell array and the sense circuit,
    the sense circuit comprising a pre-charging transistor for pre-charging a sense node and a clamp transistor connected between the sense node and a bit line, wherein the clamp transistor is coupled between the pre-charging transistor and the bit line,
    the reading part pre-charging the sense node multiple times by the pre-charging transistor and pre-charging the selected bit line multiple times by the clamp transistor.

13. The semiconductor memory device as recited in claim 12, wherein
    the reading part pre-charges the sense node to a first potential by the pre-charging transistor and pre-charges the selected bit line to a first clamp potential by the clamp transistor, and then pre-charges the selected bit line to a second clamp potential by the clamp transistor and pre-charges the sense node to a second potential by the pre-charging transistor.

14. The semiconductor memory device as recited in claim 13, wherein
    the reading part further comprises a bit line select transistor between the clamp transistor and the bit line, and the bit line select transistor pre-charges the first clamp voltage to the bit line after a first clamp voltage is generated by the clamp transistor.

15. The semiconductor memory device as recited in claim 14, wherein
    the reading part further comprises an even bit line select transistor and an odd bit line select transistor connected to the bit line select transistor, and sets the even bit line select transistor or the odd bit line select transistor to a turned-on state after the bit line select transistor is set to the turned-on state.

16. The semiconductor memory device as recited in claim 12, wherein
    the semiconductor memory device further comprises an outputting part for outputting read data and an error checking and correction part for performing an error checking and correction on the read data,
    the reading part operates during a period in which the outputting part outputs the read data and the error checking and correction part performs the error checking and correction on the read data.

17. The semiconductor memory device as recited in claim 12, wherein
    the semiconductor memory device is an NAND flash memory.

* * * * *